United States Patent
Peng et al.

(10) Patent No.: US 12,507,422 B2
(45) Date of Patent: Dec. 23, 2025

(54) HIGH-DENSITY THREE-DIMENSIONAL MULTILAYER MEMORY AND FABRICATION METHOD

(71) Applicant: CHENGDU PBM TECHNOLOGY LTD., Chengdu (CN)

(72) Inventors: Jack Zezhong Peng, San Jose, CA (US); Ke Wang, Chengdu (CN)

(73) Assignee: CHENGDU PBM TECHNOLOGY LTD., Chengdu (CN)

( * ) Notice: Subject to any disclaimer, the term of this patent is extended or adjusted under 35 U.S.C. 154(b) by 114 days.

(21) Appl. No.: 17/998,523

(22) PCT Filed: Oct. 8, 2021

(86) PCT No.: PCT/CN2021/122565
§ 371 (c)(1),
(2) Date: Nov. 11, 2022

(87) PCT Pub. No.: WO2022/252461
PCT Pub. Date: Dec. 8, 2022

(65) Prior Publication Data
US 2024/0224540 A1     Jul. 4, 2024

(30) Foreign Application Priority Data

Jun. 4, 2021 (CN) .......................... 202110625260.8

(51) Int. Cl.
*H10B 63/00* (2023.01)
*H10B 61/00* (2023.01)
*H10B 63/10* (2023.01)

(52) U.S. Cl.
CPC ............. *H10B 63/84* (2023.02); *H10B 61/10* (2023.02); *H10B 63/10* (2023.02)

(58) Field of Classification Search
CPC ........ H10B 63/84; H10B 61/10; H10B 63/10; H10B 63/845; H10B 99/16
See application file for complete search history.

(56) References Cited

U.S. PATENT DOCUMENTS

| 8,258,038 B2 | 9/2012 | Nozawa |
| 8,860,119 B2 | 10/2014 | Kim et al. |

(Continued)

FOREIGN PATENT DOCUMENTS

| CN | 109887923 | 6/2019 |
| CN | 110832643 | 2/2020 |

(Continued)

OTHER PUBLICATIONS

PCT International Application No. PCT/CN21/122565, International Search Report, dated Jun. 4, 2021, 4 pages.

(Continued)

*Primary Examiner* — Marlon T Fletcher
*Assistant Examiner* — Samuel Jonathan Smith
(74) *Attorney, Agent, or Firm* — DLA Piper LLP (US)

(57) ABSTRACT

The present disclosure provides a high-density three-dimensional multilayer memory and a fabrication method, and relates to the preparation technology of memories. The memory comprises an underlying circuit part and a basic structure body disposed above the underlying circuit part, wherein the basic structure body is divided into two independent interdigitated structures by a curve-shaped division groove, at least three memory cell holes are formed in the curve-shaped division groove side by side, a vertical electrode is disposed in each memory cell hole, and the memory medium is an insulating medium; and a buffer region is placed on the inner wall of the memory cell hole and at the position of a first conducting medium layer, the buffer region protrudes from the inner wall of the memory cell hole to the (Continued)

central axis of the memory cell hole, and the buffer region is connected to the memory medium.

2 Claims, 16 Drawing Sheets

(56) References Cited

U.S. PATENT DOCUMENTS

| | | | |
|---|---|---|---|
| 10,192,878 B1 | 1/2019 | Tsutsumi et al. | |
| 2011/0177666 A1 | 7/2011 | Nozawa | |
| 2013/0168752 A1 | 7/2013 | Kim et al. | |
| 2021/0005664 A1* | 1/2021 | Fratin | H10B 63/845 |
| 2021/0050361 A1 | 2/2021 | Hopkins et al. | |
| 2021/0074720 A1 | 3/2021 | Son et al. | |

FOREIGN PATENT DOCUMENTS

| | | |
|---|---|---|
| CN | 112397524 | 2/2021 |
| CN | 112466877 | 3/2021 |
| WO | 2011/016196 | 2/2011 |

OTHER PUBLICATIONS

First Office Action of Chinese Patent Application No. 202110625260.8, dated Jun. 8, 2023, 12 pages.

* cited by examiner

HIGH-DENSITY THREE-DIMENSIONAL MULTILAYER MEMORY AND FABRICATION METHOD

CROSS-REFERENCE TO RELATED APPLICATION

This patent application is a 371 application of PCT/CN2021/122565, filed on Oct. 8, 2021, which claims priority to CN Application No. 202110625260.8, filed Jun. 4, 2021, the disclosure of which are incorporated by reference herein in their entireties as part of the present application.

TECHNICAL FIELD

The present disclosure relates to the preparation technology of memories.

BACKGROUND

In the prior art, various digital storage technologies, including Erasable Programmable Read-Only Memory (EPROM), Electrically Erasable Programmable Read-Only Memory (EEPROM), flash memory, NAND-flash memory, hard disk, compact disc (CD), digital versatile disc (DVD), Blue-ray discs registered by the Blue-ray Disk Association, have been widely used for data storage for over 50 years. However, the lifetime of the storage medium is generally less than 5 to 10 years. The anti-fuse memory technology for big data storage is very expensive and low in memory density, and cannot meet the requirement of mass data storage.

According to the three-dimensional memory in the prior art, when the memory density is increased and the area of a memory unit is reduced, if a vertical electrode is made of N−/N+ or P−/P+ polycrystalline silicon with high resistivity, the electrode resistance is relatively high, which may give rise to a potential difference between the vertical electrodes in different layers, as well as relatively high series resistance of the memory unit, which may worsen the working performance of the normal memory.

SUMMARY

The technical problem to be solved by the present disclosure is to provide a high-density three-dimensional multilayer memory. The high-density three-dimensional multilayer memory has the characteristics of high density, low cost, low resistance for vertical electrodes, and the like.

The present disclosure also provides a fabrication method of the high-density three-dimensional multilayer memory. The fabrication method also has the advantages of processing simplification and high yield besides the above-mentioned advantages of the prepared memory.

Through the technical scheme adopted for solving the technical problem, the high-density three-dimensional multilayer memory comprises an underlying circuit part and a basic structure body disposed above the underlying circuit part, wherein the basic structure body is divided into two independent interdigitated structures, referred to as a first interdigitated structure and a second interdigitated structure respectively, by a curve-shaped division groove, wherein the basic structure body comprises first conducting medium layers and insulating medium layers alternately stacked on top of each other from bottom to top, wherein at least three memory cell holes are formed in the curve-shaped division groove side by side, wherein a vertical electrode is disposed in each memory cell hole, and an insulating isolation pillar is disposed between every two adjacent memory cell holes; the vertical electrode, the first conducting medium layer of the interdigitated structure, and the memory medium between the vertical electrode and the first conducting medium layer form a memory structure;

the memory can be a PN junction type semiconductor memory or a Schottky semiconductor memory; wherein, the memory medium is an insulating medium; and a buffer region is placed on the inner wall of the memory cell hole and at the position of the first conducting medium layer. The buffer region protrudes from the inner wall of the memory cell hole to the central axis of the memory cell hole, and the buffer region is connected to the memory medium.

The contour line of the side wall of the memory cell hole on the longitudinal section is a straight line.

The vertical electrode is in an electrical connection with the underlying circuit part.

The first conducting medium is made of a P-type semiconductor, and the vertical electrode is made of an N-type semiconductor, wherein the buffer region is made of a semiconductor material of which the doping type is the same as that of the first conducting medium and the doping concentration is lower than that of the first conducting medium;

or, the first conducting medium layer is an N-type semiconductor, and the vertical electrode is made of a P-type semiconductor, wherein the buffer region is made of a semiconductor material of which the doping type is the same as that of the first conducting medium and the doping concentration is lower than that of the first conducting medium;

or, the first conducting medium layer is made of a semiconductor material meeting the requirement of a Schottky diode, and the vertical electrode is made of a metal meeting the requirement of the Schottky diode, wherein the buffer region is made of a semiconductor material of which the doping type is the same as that of the first conducting medium and the doping concentration is lower than that of the first conducting medium.

The memory can be a resistance change memory, a magnetic phase change memory, a phase change memory or a ferroelectric memory.

The present disclosure also provides a fabrication method of a high-density three-dimensional multilayer memory, comprising the following steps:

firstly, forming a basic structure body: setting up a preset number of first conducting medium layers and insulating medium layers in such a manner that the first conducting medium layer and the insulating medium layer are alternately stacked on top of each other to form the basic structure body;

secondly, grooving the basic structure body: forming a curve-shaped division groove penetrating from the top layer to the bottom layer of the basic structure body, and dividing the basic structure body into two staggered and separated interdigitated structures by the division groove;

thirdly, forming a preset number of memory cell holes in the division groove, wherein an insulating medium is disposed between every two adjacent memory cell holes, and a vertical electrode is set in the memory cell hole, and a memory medium layer is set between the vertical electrode and the interdigitated structure; the vertical electrode, the memory medium and the first conducting medium are made of materials meeting the requirements of a preset memory, and the preset memory can be a semiconductor memory, a PN junction type semiconductor memory or a Schottky semiconductor memory; and in the third step, before the memory medium is disposed, the fabrication method comprises the following step:

placing a buffer region on the surface of a first conducting medium region on the inner wall of the division groove.

In the sixth step, the memory cell hole is penetrating through the basic structure body.

The third step comprises the following substeps:

3.1, depositing and forming a buffer region on the surface of the first conducting medium layer on the inner wall of the division groove, wherein the conductive type of the buffer region is the same as that of the first conducting medium and the doping concentration of the buffer region is lower than that of the first conducting medium;

3.2, filling the insulating medium in the division groove, etching the filled insulating medium to form the memory cell holes disposed along the division groove, and exposing the buffer region in the memory cell hole;

3.3, depositing an insulating material on the inner wall of the memory cell hole as a memory medium to form a memory medium layer covering the inner wall of the memory cell hole, and then etching the memory medium layer at the bottom of the memory cell hole to expose the underlying circuit;

3.4, disposing a vertical electrode in the memory cell hole; and the materials of the conducting medium layer, the middle medium layer and the vertical electrode layer meet one of the following conditions:

(a), the first conducting medium layer is a P-type semiconductor, and the vertical electrode layer is an N-type semiconductor;

(b), the first conducting medium layer is an N-type semiconductor, and the vertical electrode layer is a P-type semiconductor; and (c), the first conducting medium layer is made of a semiconductor material meeting the requirement of a Schottky diode, and the vertical electrode is made of a metal meeting the requirement of the Schottky diode.

Or, the third step comprises the following substeps:

(3.1), filling the insulating medium in the division groove, and etching the filled insulating medium to form the memory cell holes disposed along the division groove;

(3.2), depositing and forming a buffer region on the surface of the first conducting medium layer on the inner wall of the memory cell hole, wherein the conductive type of the buffer region is the same as that of the first conducting medium and the doping concentration of the buffer region is lower than that of the first conducting medium;

(3.3), depositing an insulating material in the memory cell hole as a memory medium to form a memory medium layer covering the inner wall of the memory cell hole, and then etching the memory medium layer at the bottom of the memory cell hole to expose an underlying circuit;

(3.4), disposing a vertical electrode in the memory cell hole; and the materials of the conducting medium layer, the middle medium layer, and the vertical electrode layer meet one of the following conditions:

(a), the first conducting medium layer is a P-type semiconductor, and the vertical electrode layer is an N-type semiconductor;

(b), the first conducting medium layer is an N-type semiconductor, and the vertical electrode layer is a P-type semiconductor; and (c), the first conducting medium layer is made of a semiconductor material meeting the requirement of a Schottky diode, and the vertical electrode is made of a metal meeting the requirement of the Schottky diode.

Or, the third step comprises the following substeps:

(3.1), depositing and forming a buffer region on the surface of the first conducting medium layer on the inner wall of the division groove, wherein the conductive type of the buffer region is the same as that of the first conducting medium and the doping concentration of the buffer region is lower than that of the first conducting medium;

(3.2), depositing an insulating material on the inner wall of the division groove as a memory medium to form a memory medium layer covering the inner wall of the memory cell hole, and then etching the memory medium layer at the preset position of the vertical electrode to expose an underlying circuit;

(3.3) depositing an electrode material in the division groove to form an electrode material region;

(3.4) etching the electrode material region in the division groove to form isolation holes disconnecting the electrode material region, wherein the electrode material region is divided into the separated vertical electrodes through the isolation holes;

(3.5) filling an insulating material in the isolation holes; and the materials of the conducting medium layer, the middle medium layer and the vertical electrode layer meet one of the following conditions:

(a), the first conducting medium layer is a P-type semiconductor, and the vertical electrode layer is an N-type semiconductor;

(b), the first conducting medium layer is an N-type semiconductor, and the vertical electrode layer is a P-type semiconductor; and (c), the first conducting medium layer is made of a semiconductor material meeting the requirement of a Schottky diode, and the vertical electrode is made of a metal meeting the requirement of the Schottky diode.

The memory has the beneficial effects that the memory is high in memory density and low in interlayer resistance, and improves the stability of memory work performance. The fabrication method is low in processing cost and high in yield, wherein a multilayer 2-bit OTP memory unit is formed from a semiconductor deep groove etching through deep trench medium isolation, only two times of deep trench etching and filling are needed in the process, and cell isolation and left and right interdigitated isolation can be completed in one step. Only the minimum size of a memory cell array is limited by the deep trench etching process, and the minimum size of the isolation groove only needs to be thick enough to achieve an insulation effect, so that higher density can be obtained. The consistency is good, except for a very small number of sacrificial cells, and the programmable medium of the memory cell is not damaged by the etching process, specifically, the process parameters are easier to control.

BRIEF DESCRIPTION OF THE DRAWINGS

FIG. 19 is a schematic cross-sectional view of a prototype structure body in the A-A' direction in the B5 step of the second embodiment.

Wherein.

DETAILED DESCRIPTION OF THE EMBODIMENTS

Ideally, the widths of the top and the bottom of grooves or holes formed by the etching process are consistent, but in the actual process, it is very difficult to keep the widths of the top and the bottom consistent. The schematic cross-sectional view of a prototype structure body in the A-A' direction is shown according to actual conditions, so the division groove is a trapezoid with a wide upper part and a narrow lower part on the longitudinal profile view. For simplicity, the top view does not show the trapezoidal structure and is hereby described.

The material of each part of the present disclosure may be one of the six items in the following table:

| | First conducting medium | Buffer layer | Memory medium | Vertical electrode |
|---|---|---|---|---|
| 1 | N+ semiconductor | Lightly-doped N-type semiconductor | Insulating medium | P+ semiconductor |
| 2 | N+ semiconductor | Lightly-doped N-type semiconductor | Insulating medium | P-type Schottky metal such as Al, Ag, Au and Pt |
| 3 | P+ semiconductor | Lightly-doped P-type semiconductor | Insulating medium | N+ semiconductor or conductor |
| 4 | P+ semiconductor | Lightly-doped type semiconductor | P-Insulating medium | N-type Schottky metal such as N + Poly, N + Si and IZO (IZO indium zinc oxide) |
| 5 | Metal | Lightly-doped N-type semiconductor | Insulating medium | P-type Schottky metal such as Al, Ag, Au and Pt |
| 6 | Metal | Lightly-doped P-type semiconductor | Insulating medium | N-type Schottky metal such as N+ Poly – Si, N + Si, and IZO (IZO indium zinc oxide) |

In the present disclosure, if the first conducting medium is a semiconductor, the conductive type (P type or N type) of the buffer layer being a buffer region formed by substrate-selective deposition is the same as that of the first conducting medium, whereas the doping concentration is lower than that of the first conducting medium. If the memory is a PN junction memory, the vertical electrode is a P-type semiconductor, and the first conducting medium is an N-type semiconductor, the buffer region is a lightly-doped N-type semiconductor (namely, an N-semiconductor). If the memory is a Schottky memory, the vertical electrode is P-type Schottky metal, and the first conducting medium is an N-type semiconductor or a metal in ohmic contact with the buffer layer, wherein the buffer region is a lightly-doped N-type semiconductor (namely, an N-semiconductor). The doping concentration and thickness of the buffer layer are optimized according to device performance. For example, the first conducting medium is an N-type semiconductor, and the doping concentration of the buffer layer is generally lower than that of the first conducting medium.

Embodiment I

Figure 1:
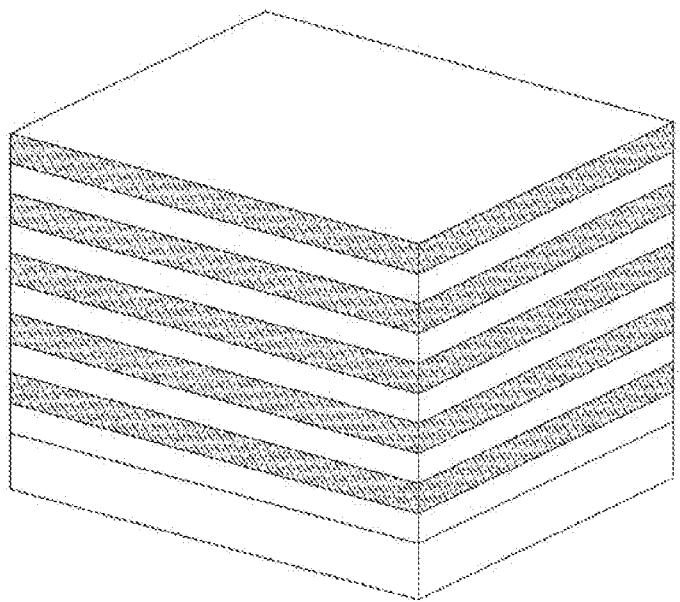
FIG. 1 is a schematic perspective view of a basic structure body.
Figure 2:
FIG. 2 is a schematic top view of a prototype structure body in the present disclosure.
Figure 3:
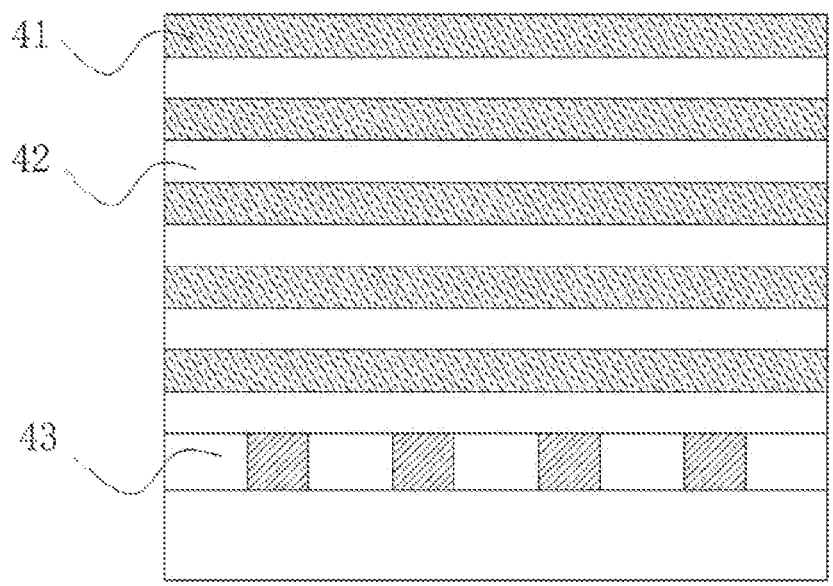
FIG. 3 is a schematic cross-sectional view of a prototype structure body in the present disclosure.

This embodiment is the first embodiment of the fabrication method. The fabrication method comprises the following steps:

A1, forming a basic structure body on an underlying circuit 43: setting up a preset number of first conducting medium layers and insulating medium layers in such a manner that the first conducting medium layers 41 and the insulating medium layers 42 are alternately stacked on top of each other to form a basic structure body, referring to FIG. 2 and FIG. 3.

Figure 4:
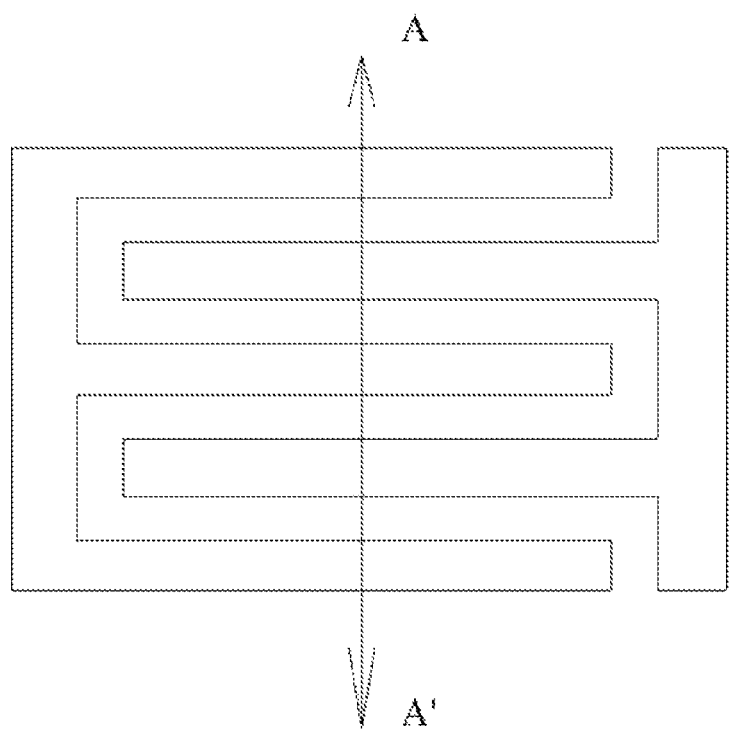
FIG. 4 is a schematic top view of a prototype structure body designed with a curved division groove.
Figure 5:
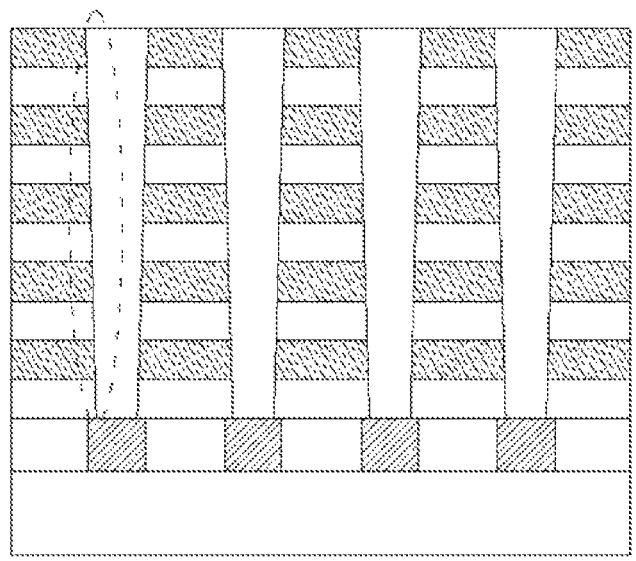
FIG. 5 is a schematic cross-sectional view of a prototype structure body designed with a curved division groove in the A-A' direction.

A2, grooving the basic structure body: forming a curve-shaped division groove penetrating from the top layer to the bottom layer of the basic structure body, and dividing the basic structure body into two staggered and separated interdigitated structures by the division groove, referring to FIG. 4 and FIG. 5.

Figure 6:
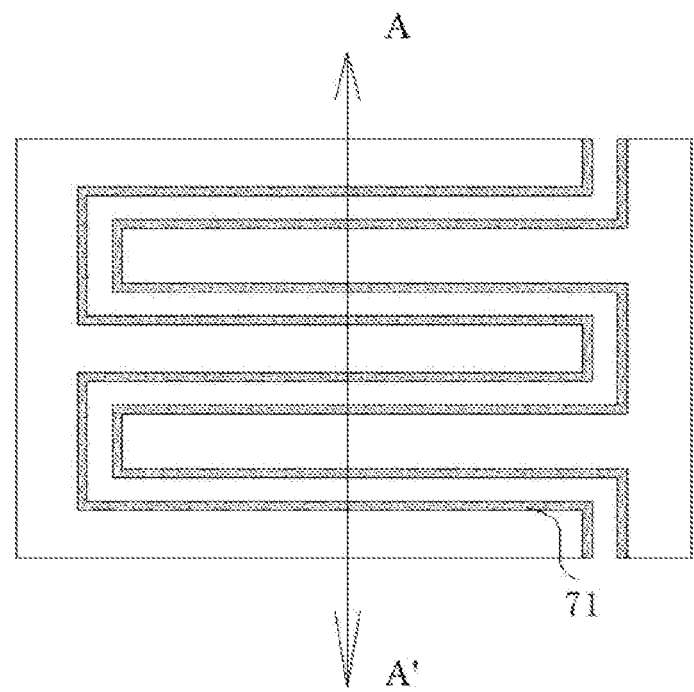
FIG. 6 is a schematic top view of a prototype structure body in the A1 step of the first embodiment.
Figure 7:
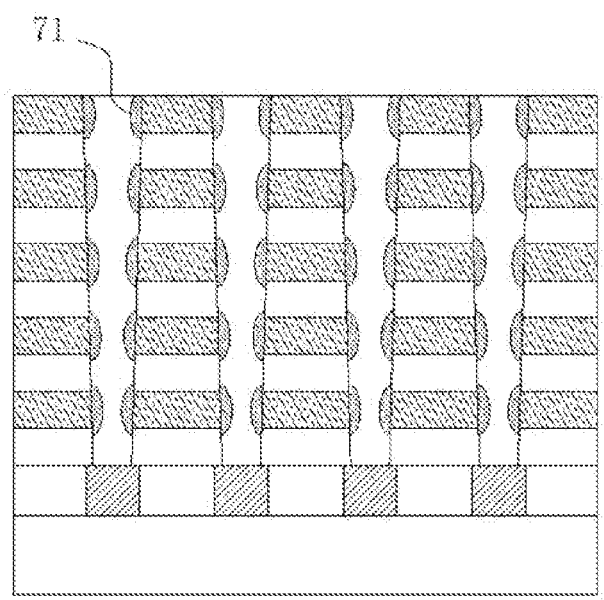
FIG. 7 is a schematic cross-sectional view of a prototype structure body in the A-A' direction in the A1 step of the first embodiment.

A3, performing substrate-selective deposition on the first conducting medium area located on the inner wall of the division groove to form a buffer region 71 made of a lightly-doped semiconductor material in the surface area of the first conducting medium on the inner wall of the division groove, referring to FIG. 6 and FIG. 7. The surface of the first conducting medium area on the inner wall of the division groove is completely covered with the buffer region. Preferably, the insulating medium layers above and below the first conducting medium layer are partially covered by the buffer region on the inner wall of the division groove, so that the effect of the buffer region between the vertical electrode and the first conducting medium is guaranteed after the memory medium is broken down.

Figure 8:
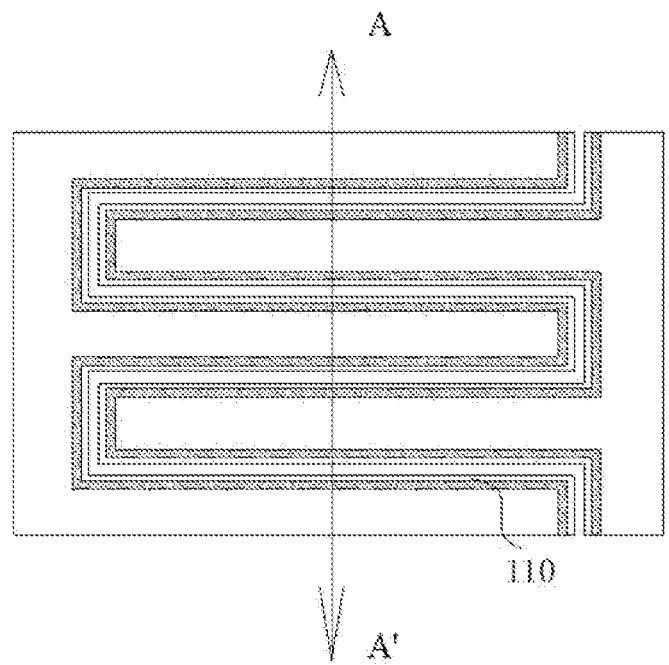
FIG. 8 is a schematic top view of a prototype structure body in the A2 step of the first embodiment.
Figure 9:
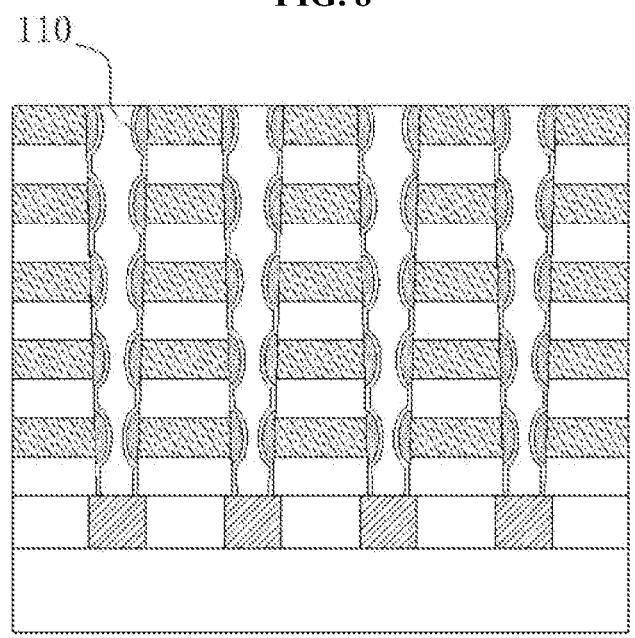
FIG. 9 is a schematic cross-sectional view of a prototype structure body in the A-A' direction in the A2 step of the first embodiment.

A4, depositing an insulating material as a memory medium on the inner wall of the division groove after step A3 to form a memory medium layer 110 covering the inner wall of the memory cell hole, referring to FIG. 8 and FIG. 9; and performing penetrating treatment on the memory medium layer at the bottom of the division groove and the vertical electrode, seeing details as follows.

Figure 10:
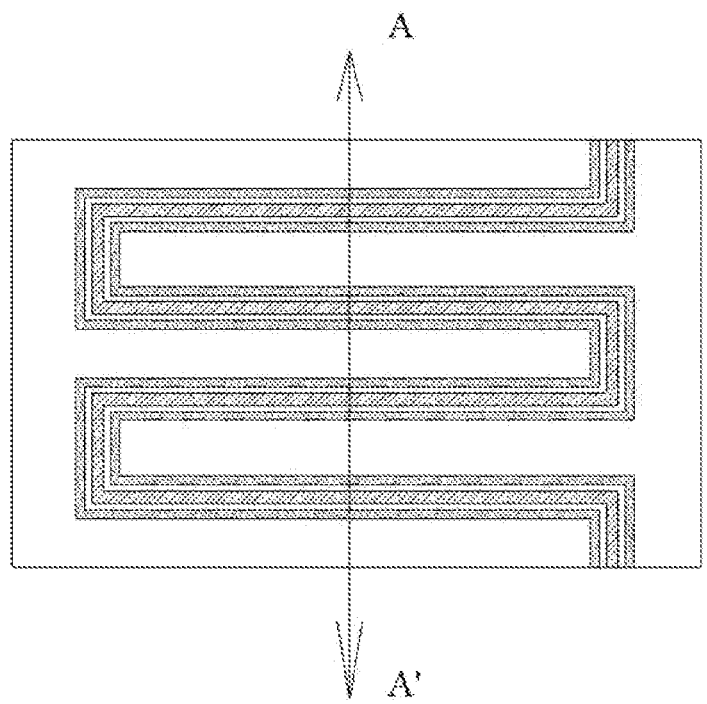
FIG. 10 is a schematic top view of a prototype structure body in the A3 step of the first embodiment.
Figure 11:
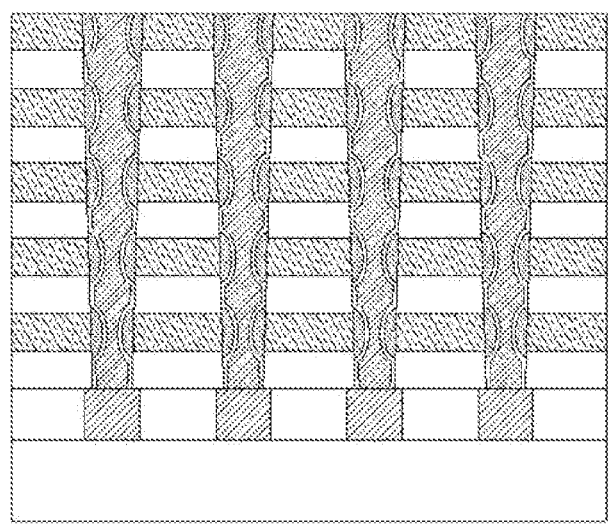
FIG. 11 is a schematic cross-sectional view of a prototype structure body in the A-A' direction in the A3 step of the first embodiment.

A5, filling an electrode material in the division groove to form an electrode material region, referring to FIG. 10 and FIG. 11.

Figure 12:
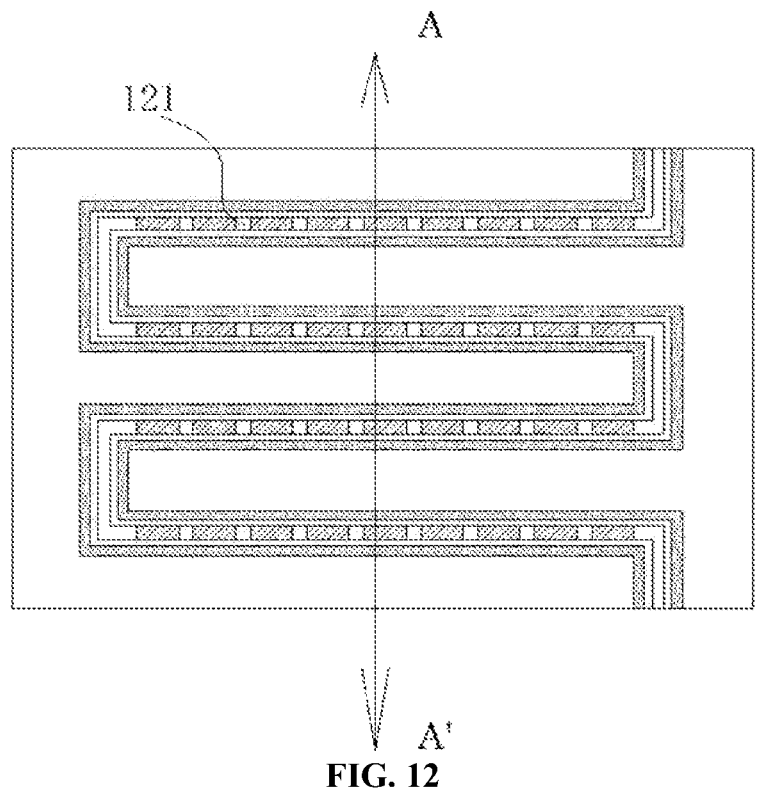
FIG. 12 is a schematic top view of a prototype structure body in the A4 step of the first embodiment.
Figure 13:
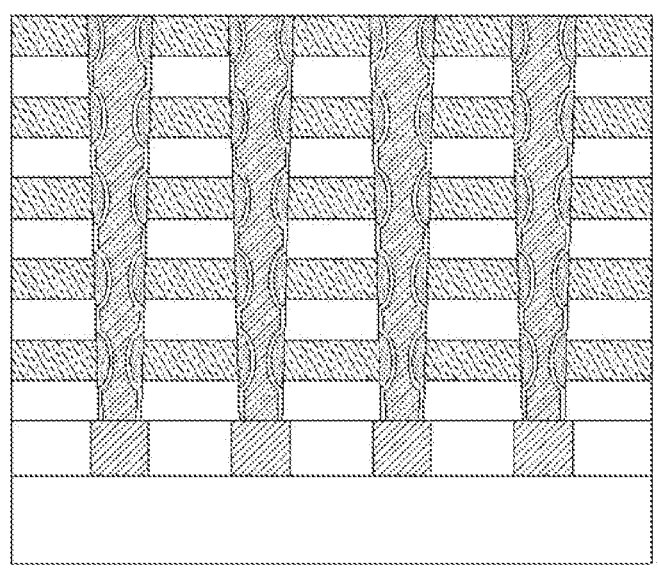
FIG. 13 is a schematic cross-sectional view of a prototype structure body in the A-A' direction in the A4 step of the first embodiment.

A6, using a mask etching process to get isolation holes along the division groove filled with the electrode material. The electrode material region is divided into a plurality of secrete vertical electrodes by the isolation holes. In the present disclosure, the width of the isolation hole can be very small (such as 10 nm and below) and is kept no lower than the breakdown thickness of the insulating medium (such as the breakdown thickness of a silicon dioxide layer being 0.5-5 nm), referring to FIG. 12 and FIG. 13.

Figure 14:
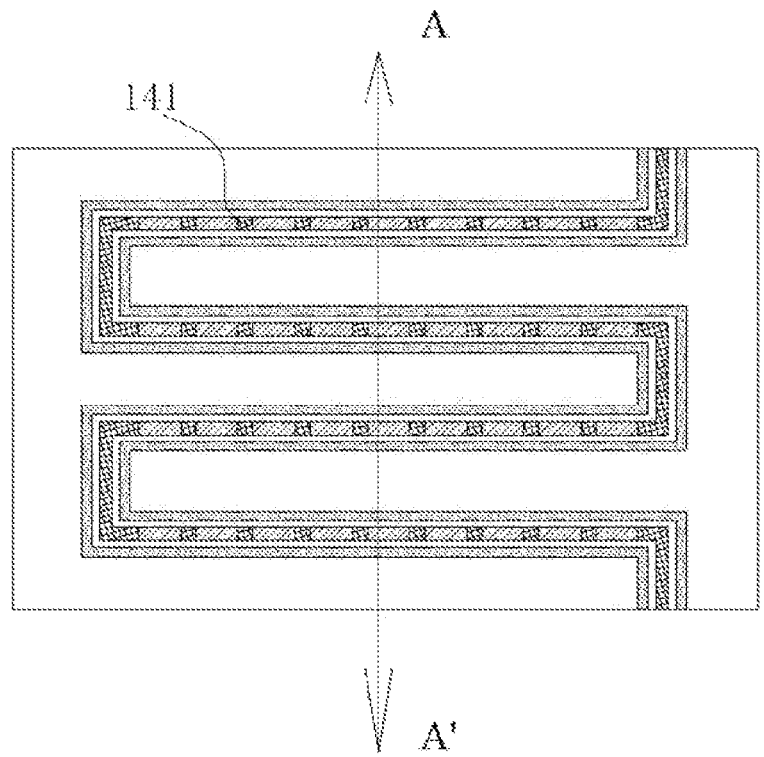
FIG. 14 is a schematic top view of a prototype structure body in the A5 step of the first embodiment.
Figure 15:
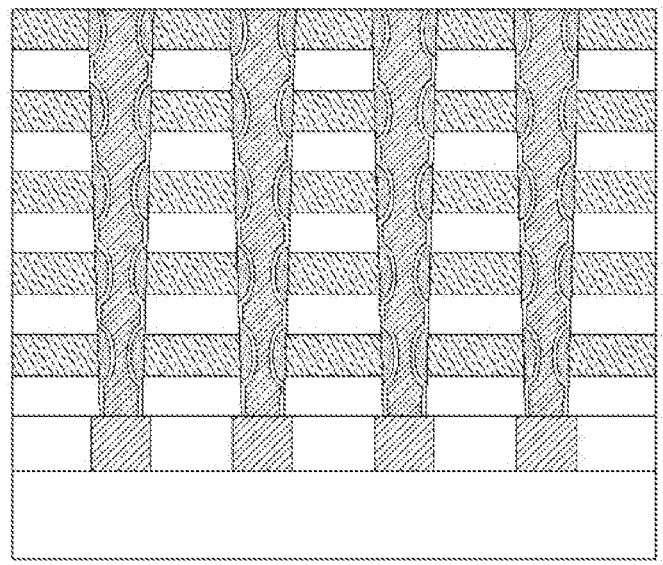
FIG. 15 is a schematic cross-sectional view of a prototype structure body in the A-A' direction in the A5 step of the first embodiment.

A7, filling an insulating medium 141 in the isolation holes, referring to FIG. 14 and FIG. 15.

After the deposition process in the A4, an isolation will be formed at the bottom area of the division groove, and the vertical electrode filled in the memory cell hole in step A7 will be isolated from the underlying circuit. Therefore, the insulating medium deposited at the bottom of the division groove needs to be penetrated, so that the vertical electrode and the underlying circuit are in conductive connection.

In the first penetration method, after the A4 step is completed, penetration holes are etched in the insulating medium at the bottom until the underlying circuit is exposed, so that the vertical electrodes formed from step A5 to A7 are in direct contact with the underlying circuit, and the method is called etching penetration.

In the second penetration method, before step A7, the insulating medium at the bottom is not dealt with. After the vertical electrode is formed ed, a dielectric breakdown voltage is applied between the vertical electrode and the underlying circuit, and the insulating medium at the bottom in the memory cell hole, between the vertical electrode and the underlying circuit is broken down to become a conductive connection.

Embodiment II

This embodiment is the second embodiment of the fabrication method. The fabrication method comprises the following steps:

B1, forming a basic structure body on an underlying circuit 43: setting up a preset number of first conducting medium layers and insulating medium layers in a such manner that the first conducting medium layers 41 and the insulating medium layers 42 are alternately stacked on top of each other to form a basic structure body, referring to FIG. 2 and FIG. 3;

B2, grooving the basic structure body: forming a curve-shaped division groove penetrating from the top layer to the bottom layer of the basic structure body, and dividing the basic structure body into two staggered and separated interdigitated structures by the division groove, referring to FIG. 4 and FIG. 5;

B3, performing substrate-selective deposition on the surface area of the first conducting medium located on the inner wall of the division groove to form a buffer region 71 made of a lightly-doped semiconductor material, referring to FIG. 6 and FIG. 7.

Figure 16:
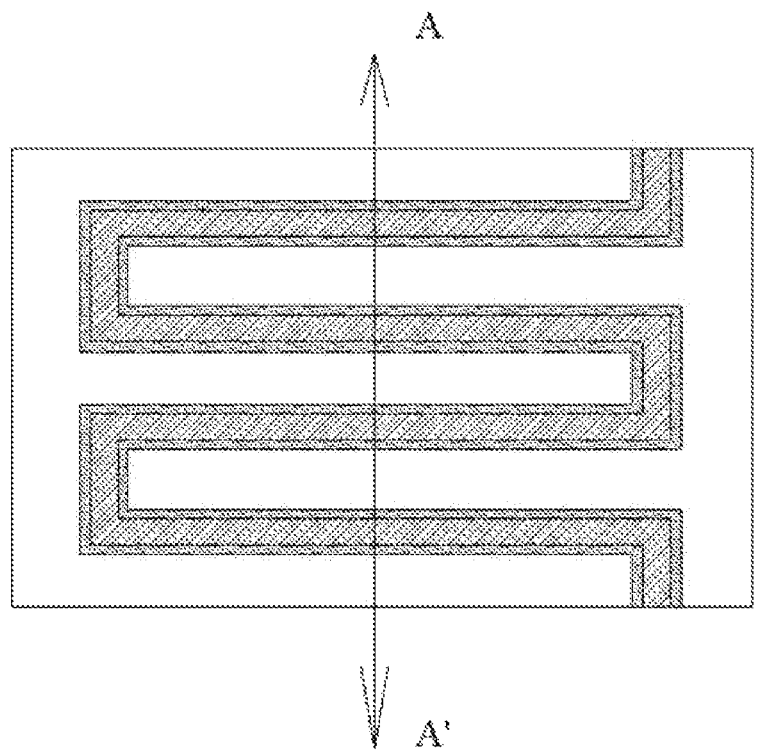
FIG. 16 is a schematic top view of a prototype structure body in the B4 step of the second embodiment.
Figure 17:
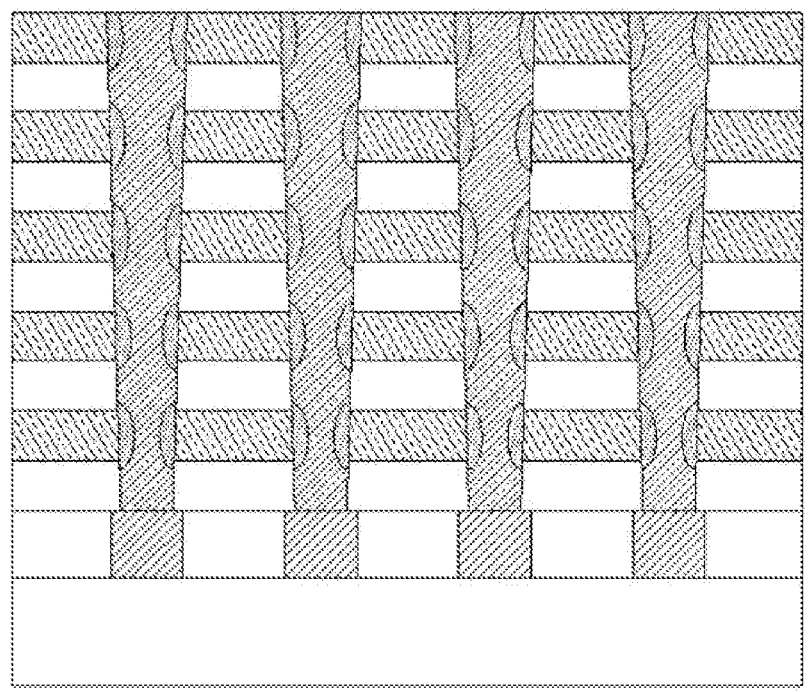
FIG. 17 is a schematic cross-sectional view of a prototype structure body in the A-A' direction in the B4 step of the second embodiment.

B4, filling an insulating medium in the division groove, referring to FIG. 16 and FIG. 17.

Figure 18:
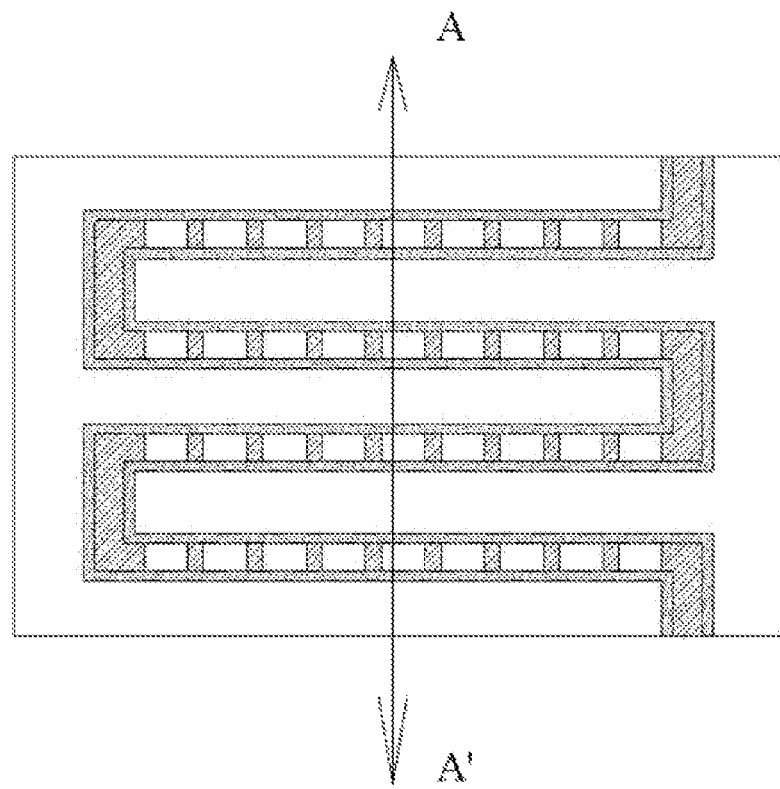
FIG. 18 is a schematic top view of a prototype structure body in the B5 step of the second embodiment.
Figure 19A:
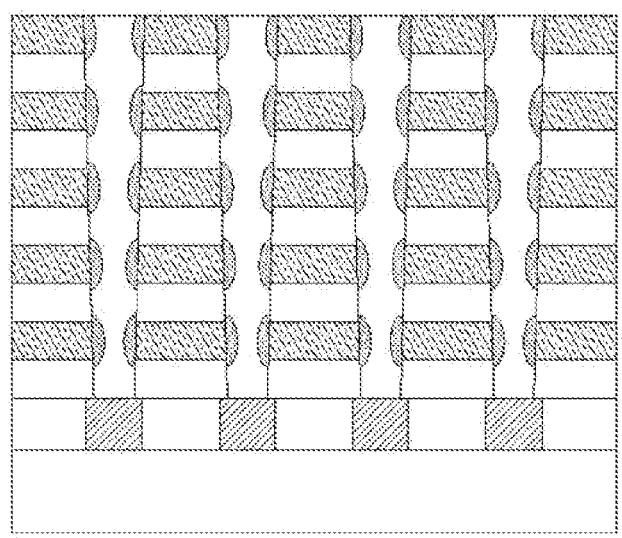
FIG. 19A is a schematic diagram of a first etching state of the second embodiment.
Figure 19B:
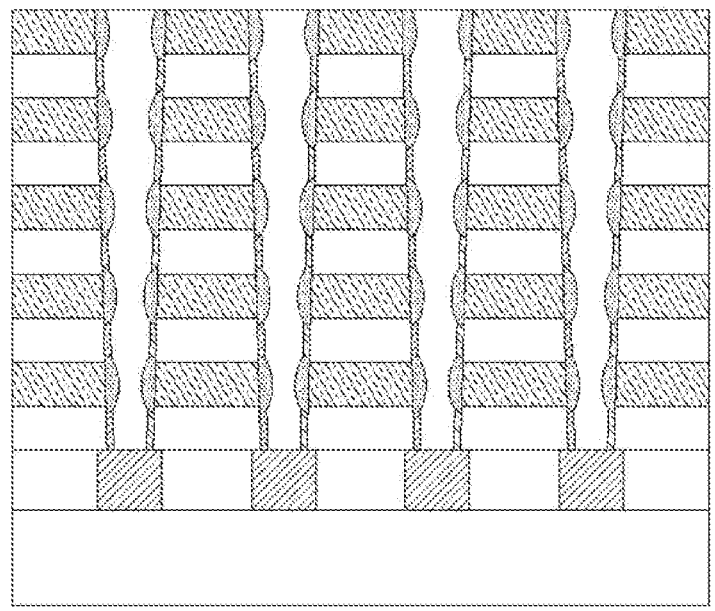
FIG. 19B is a schematic diagram of a second etching state of the second embodiment.

B5, etching an insulating medium in the division groove to form memory cell units, as shown in FIG. 18 and FIG. 18. FIG. 19A illustrates etching in an ideal condition, and the insulating medium deposited on the inner wall of the division groove is completely etched. In reality, the insulating medium deposited in step B4 between the buffer regions can also remain to reduce the process cost, as shown in FIG. 19B.

Figure 20:
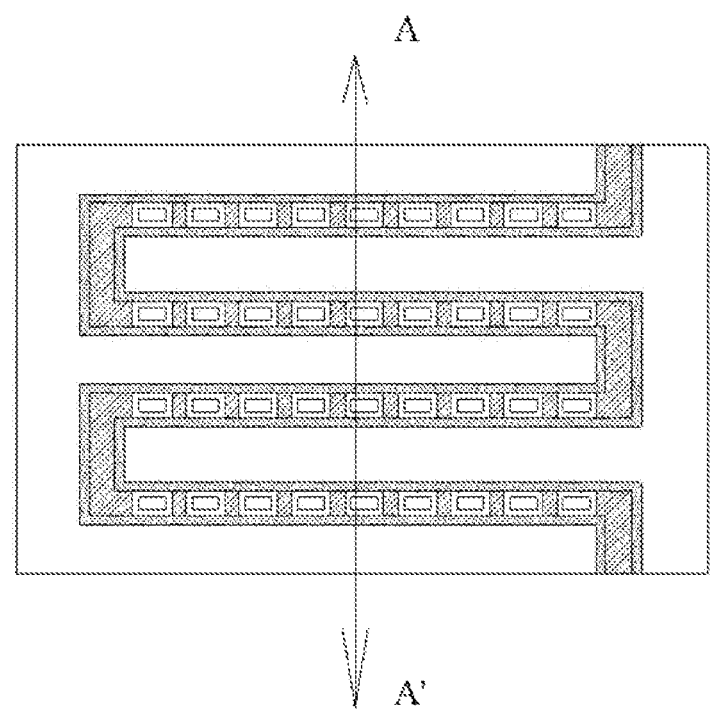
FIG. 20 is a schematic top view of a prototype structure body in the B6 step of the second embodiment.
Figure 21:
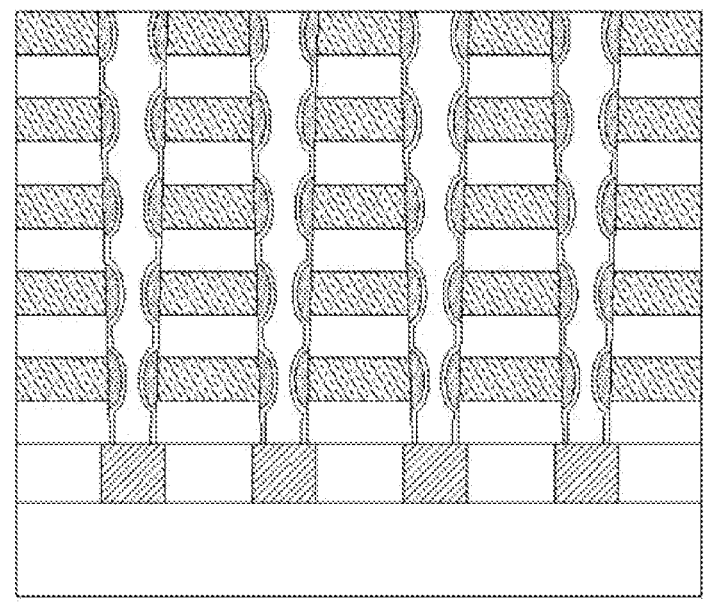
FIG. 21 is a schematic cross-sectional view of a prototype structure body in the A-A' direction in the B6 step of the second embodiment.

B6, depositing an insulating material as a memory medium on the inner wall of the memory cell hole to form a memory medium layer covering the inner wall of the memory cell hole, as shown in FIG. 20 and FIG. 21.

Figure 22:
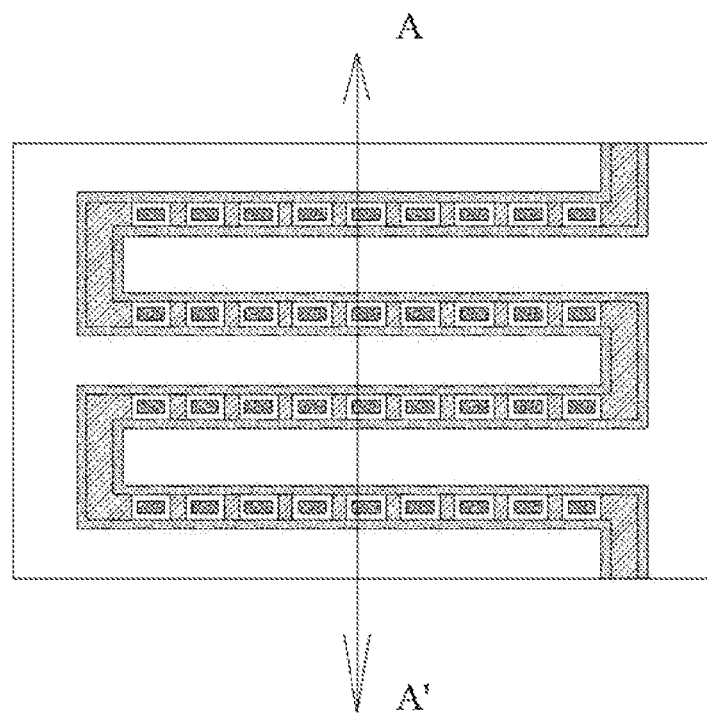
FIG. 22 is a look-down schematic diagram of a prototype structure body in the B7 step of the second embodiment.
Figure 23:
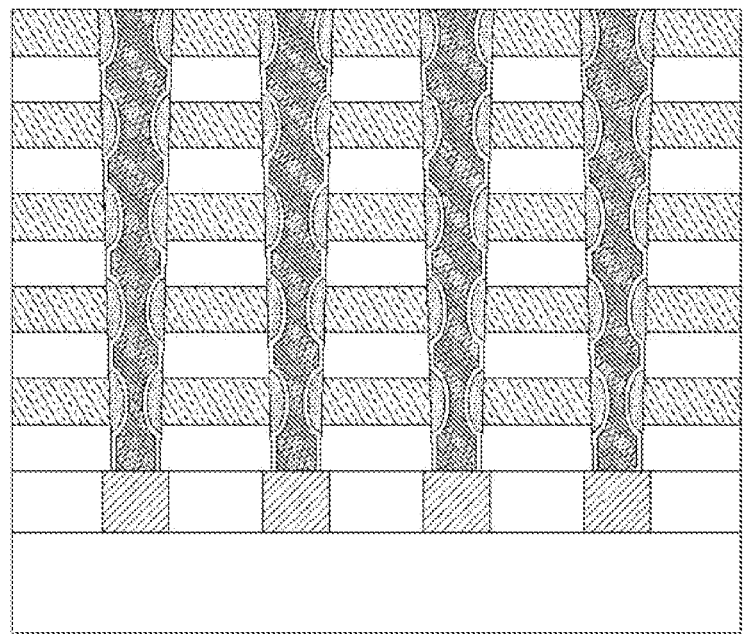
FIG. 23 is a schematic cross-sectional view of a prototype structure body in the A-A' direction in the B7 step of the second embodiment.

B7, placing a vertical electrode in the memory cell unit, as shown in FIG. 22 and FIG. 23.

The penetration of the insulating medium at the bottom of the memory cell hole is similar to that of the first embodiment.

Embodiment III

Figure 24:
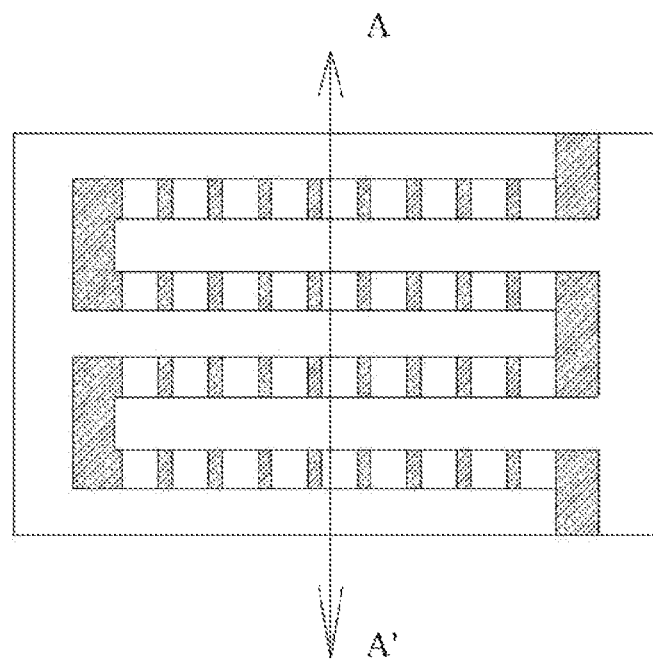
FIG. 24 is a schematic top view of a prototype structure body in the C3 step of the second embodiment.
Figure 25:
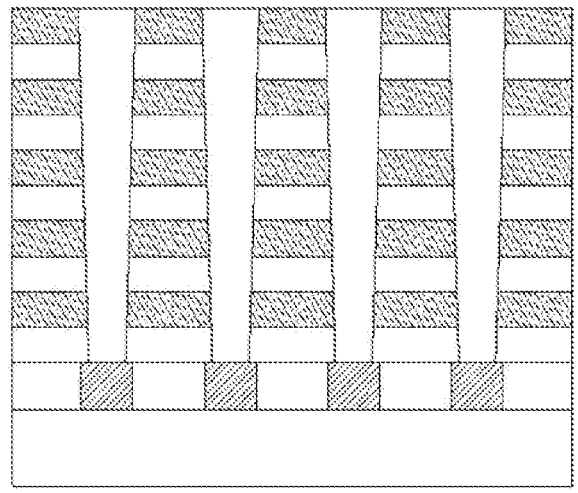
FIG. 25 is a schematic cross-sectional view of a prototype structure body in the A-A' direction in the C3 step of the second embodiment.
Figure 26:
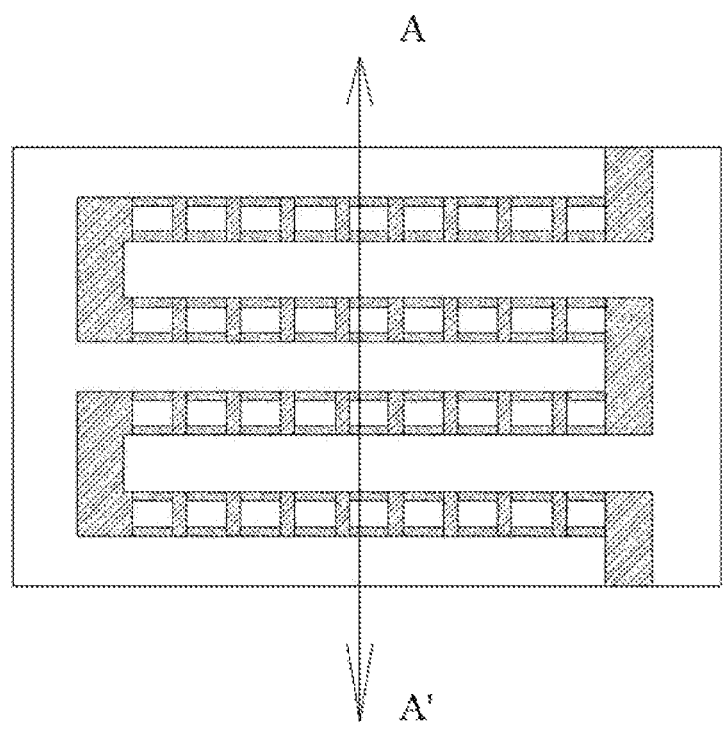
FIG. 26 is a schematic top view of a prototype structure body in the C4 step of the third embodiment.
Figure 27:
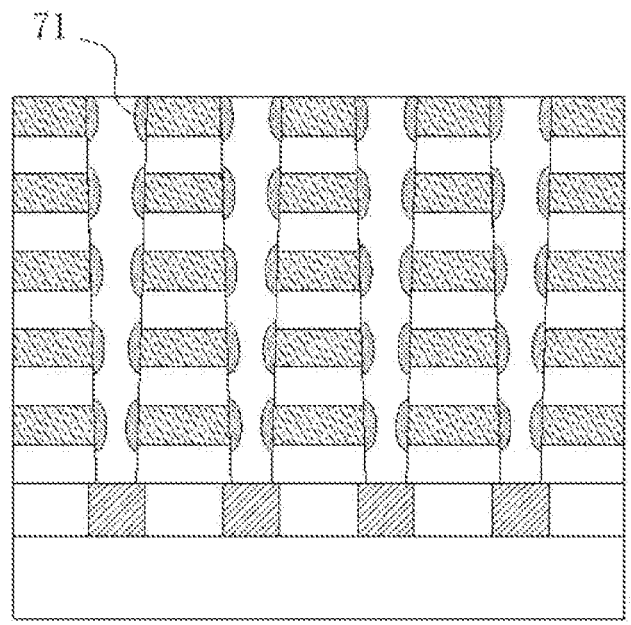
FIG. 27 is a schematic cross-sectional view of a prototype structure body in the A-A' direction in the C4 step of the third embodiment.
Figure 28:
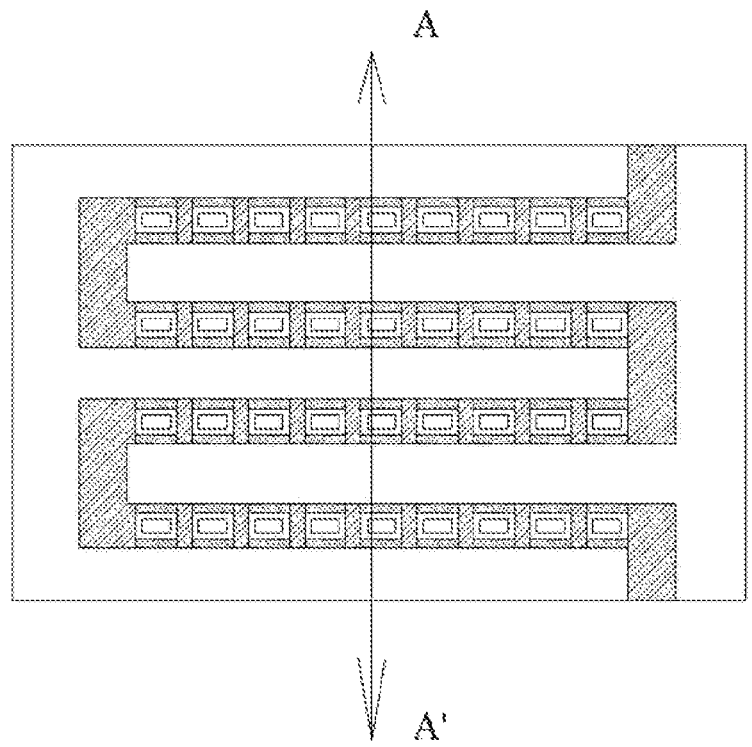
FIG. 28 is a schematic top view of a prototype structure body in the C5 step of the third embodiment.
Figure 29:
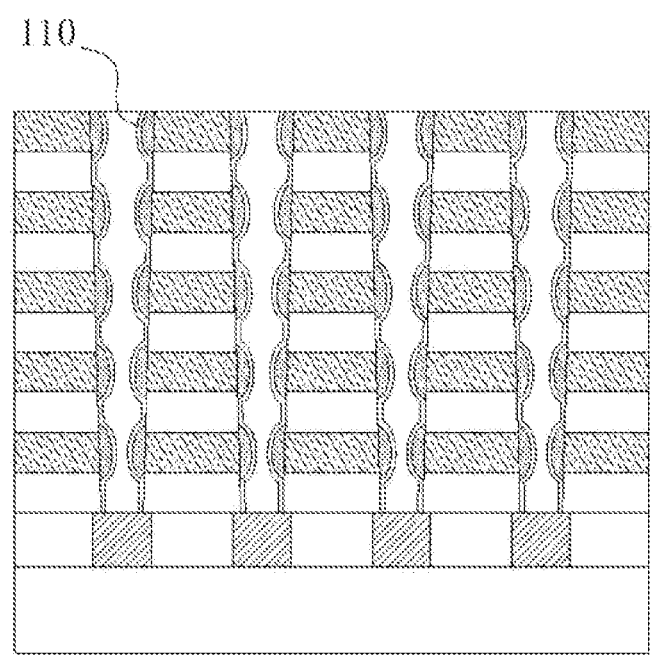
FIG. 29 is a schematic cross-sectional view of a prototype structure body in the A-A' direction in the C5 step of the third embodiment.

This embodiment is the third embodiment of the fabrication method. The fabrication method comprises the following steps:
- C1, forming a basic structure body on an underlying circuit 43: setting up a preset number of first conducting medium layers and insulating medium layers in such a manner that the first conducting medium layers 41 and the insulating medium layers 42 are alternately stacked on top of each other to form a basic structure body, referring to FIG. 2 and FIG. 3.
- C2, grooving the basic structure body: forming a curve-shaped division groove penetrating from the top layer to the bottom layer of the basic structure body, and dividing the basic structure body into two staggered and separated interdigitated structures by the division groove, referring to FIG. 4 and FIG. 5.
- C3, filling an insulating medium in the division groove, and then etching the insulating medium to form memory cell holes, referring to FIG. 24 and FIG. 25.
- C4, performing substrate-selective deposition on the surface area of the first conducting medium located on the inner wall of the memory cell hole to form a buffer region made of a lightly-doped semiconductor material, referring to FIG. 26 and FIG. 27.
- C5, depositing an insulating material as a memory medium on the inner wall of the memory cell hole to form a memory medium layer 110 covering the inner wall of the memory cell hole, as shown in FIG. 28 and FIG. 29.
- C6, placing a vertical electrode in the memory cell hole.

The penetration of the insulating medium at the bottom area in the memory cell hole is similar to that of the first embodiment.

Embodiment IV

In this embodiment, the memory is a high-density three-dimensional multilayer memory. The structure of the memory refers to the figures of the fabrication method. In this embodiment, the high-density three-dimensional multilayer memory comprises an underlying circuit part and a basic structure body disposed above the underlying circuit part, wherein the basic structure body is divided into two independent interdigitated structures, referred to as a first interdigitated structure and a second interdigitated structure respectively, by a curve-shaped division groove, wherein the basic structure body comprises first conducting medium layers and insulating medium layers alternately stacked on top of each other from bottom to top, wherein at least three memory cell holes are formed in the curve-shaped division groove side by side, a vertical electrode is set in each memory cell hole, and an insulating isolation pillar is set between every two adjacent memory cell holes.

The vertical electrode, the first conducting medium layer of the interdigitated structure, and the memory medium between the vertical electrode and the first conducting medium layer form a memory structure.

The memory can be a PN junction type semiconductor memory or a Schottky semiconductor memory.

The memory medium is an insulating medium.

A buffer region is placed on the inner wall of the memory cell hole at the position of the first conducting medium layer, wherein the buffer region protrudes from the inner wall of the memory cell hole to the central axis of the memory cell hole, and the buffer region is connected to the memory medium. The contour line of the side wall of the memory cell hole on the longitudinal section is a straight line, and the longest straight line in the dotted oval of FIG. 5 is a part of the contour line of the memory cell hole in the longitudinal cross-section.

What is claimed is:

1. A fabrication method of a high-density three-dimensional multilayer memory, comprising the following steps:
    firstly, forming a basic structure body: setting up a preset number of first conducting medium layers and insulating medium layers in such a manner that the first conducting medium layers and the insulating medium layers are alternately stacked on top of each other to form a basic structure body;
    secondly, grooving the basic structure body: forming a curve-shaped division groove penetrating from the top layer to the bottom layer of the basic structure body, and dividing the basic structure body into two staggered and separated interdigitated structures by the division groove;
    thirdly, forming a preset number of memory cell holes in the division groove, wherein an insulating medium is disposed between every two adjacent memory cell holes, a vertical electrode is set in the memory cell hole, and a memory medium layer is set between the vertical electrode and the interdigitated structure; the vertical electrode, the memory medium and the first conducting medium are made of materials meeting the requirements of a preset memory, and the memory is a PN junction type semiconductor memory or a Schottky semiconductor memory; and
    in the third step, before the memory medium is disposed, the fabrication method comprises the following step:
    placing a buffer region on the surface of a first conducting medium area on the inner wall of the division groove;
    wherein
    the third step comprises the following substeps:
    depositing and forming a buffer region on the surface of the first conducting medium layer on the inner wall of the division groove, wherein the conductive type of the buffer region is the same as that of the first conducting medium and the doping concentration of the buffer region is lower than that of the first conducting medium;
    filling the insulating medium in the division groove, etching the filled insulating medium to form the memory cell holes disposed along the division groove, and exposing the buffer region in the memory cell hole;
    depositing an insulating material on the inner wall of the memory cell hole as a memory medium to form a memory medium layer covering the inner wall of the memory cell hole, and then etching the memory medium layer at the bottom of the memory cell hole to expose an underlying circuit;
    disposing a vertical electrode in the memory cell hole; and the materials of the conducting medium layer, the middle medium layer and the vertical electrode layer meet one of the following conditions:

the first conducting medium layer is a P-type semiconductor, and the vertical electrode layer is an N-type semiconductor;

the first conducting medium layer is an N-type semiconductor, and the vertical electrode layer is a P-type semiconductor; and the first conducting medium layer is made of a semiconductor material meeting the requirement of a Schottky diode, and the vertical electrode is made of a metal meeting the requirement of the Schottky diode.

2. The fabrication method of a high-density three-dimensional multilayer memory according to claim 1, wherein in the third step, the memory cell hole is penetrating through the basic structure body.

* * * * *